United States Patent
Zhao

(10) Patent No.: US 7,781,303 B2
(45) Date of Patent: Aug. 24, 2010

(54) METHOD FOR PREPARING A SHALLOW TRENCH ISOLATION

(75) Inventor: Hai Jun Zhao, Hsinchu (TW)

(73) Assignee: Promos Technologies Inc., Hsinchu (TW)

( * ) Notice: Subject to any disclaimer, the term of this patent is extended or adjusted under 35 U.S.C. 154(b) by 517 days.

(21) Appl. No.: 11/774,934

(22) Filed: Jul. 9, 2007

(65) Prior Publication Data

US 2008/0286936 A1 Nov. 20, 2008

(30) Foreign Application Priority Data

May 16, 2007 (TW) ............................... 96117335 A

(51) Int. Cl.
 *H01L 21/76* (2006.01)
(52) U.S. Cl. ................. 438/424; 438/294; 438/295; 438/435; 257/E21.556
(58) Field of Classification Search ................. 438/424, 438/294, 295, 296, 435; 257/E21.556
See application file for complete search history.

(56) References Cited

U.S. PATENT DOCUMENTS

| | | | | |
|---|---|---|---|---|
| 5,106,776 | A * | 4/1992 | Shen et al. | 438/248 |
| 5,372,950 | A * | 12/1994 | Kim et al. | 438/444 |
| 5,888,880 | A * | 3/1999 | Gardner et al. | 438/424 |
| 6,444,528 | B1 * | 9/2002 | Murphy | 438/270 |
| 6,613,646 | B1 * | 9/2003 | Sahota et al. | 438/424 |
| 6,709,930 | B2 * | 3/2004 | Chan et al. | 438/270 |
| 6,762,103 | B2 * | 7/2004 | Kwak et al. | 438/296 |
| 7,012,005 | B2 * | 3/2006 | Lichtenberger et al. | 438/270 |
| 7,176,104 | B1 * | 2/2007 | Chen et al. | 438/424 |
| 2003/0162366 | A1 * | 8/2003 | Puchner et al. | 438/446 |
| 2006/0226559 | A1 * | 10/2006 | Mehrotra et al. | 257/E21.547 |
| 2008/0153256 | A1 * | 6/2008 | Niimi et al. | 438/439 |
| 2008/0293213 | A1 * | 11/2008 | Yang et al. | 438/433 |

* cited by examiner

*Primary Examiner*—Matthew Smith
*Assistant Examiner*—John M Parker
(74) *Attorney, Agent, or Firm*—WPAT, P.C.; Anthony King

(57) ABSTRACT

A method for preparing a shallow trench isolation comprising the steps of forming at least one trench in a semiconductor substrate, performing an implanting process to implant nitrogen-containing dopants into an upper sidewall of the trench such that the concentration of the nitrogen-containing dopants in the upper sidewall is higher than that in the bottom sidewall of the trench, forming a spin-on dielectric layer filling the trench and covering the surface of the semiconductor substrate, performing a thermal oxidation process to form a silicon oxide layer covering the inner sidewall. Since the nitrogen-containing dopants can inhibit the oxidation rate and the concentration of the nitrogen-containing dopants in the upper inner sidewall is higher than that in the bottom inner sidewall of the trench, the thickness of the silicon oxide layer formed by the thermal oxidation process is larger at the bottom portion than at the upper portion of the trench.

18 Claims, 5 Drawing Sheets

METHOD FOR PREPARING A SHALLOW TRENCH ISOLATION

BACKGROUND OF THE INVENTION (A) Field of the Invention

The present invention relates to a method for preparing a shallow trench isolation, and more particularly, to a method for preparing a shallow trench isolation without using a silicon nitride liner layer but having a silicon oxide layer with a larger thickness at the bottom portion than at the upper portion of the trench.

(B) Description of the Related Art

Conventional integrated circuit fabrication processes use a local oxidation of silicon (LOCOS) technique or shallow trench isolation (STI) technique to electrically isolate wafer-mounted electronic devices from each other, so as to avoid short circuits and cross interference. Due to the LOCOS technique's forming a field oxide layer covering a larger wafer area and also because it forms a "bird's beak" pattern, advanced integrated circuit fabrication generally selects the STI technique to electrically isolate electronic devices.

FIG. 1 to FIG. 4 illustrate a method for preparing a shallow trench isolation 10 according to the prior art. First, a mask 15 having several openings 18 is formed on a silicon substrate 12, with the mask 15 including a pad oxide layer 14 and a pad nitride layer 16. Subsequently, an anisotropic etching process is performed to form a plurality of trenches 20 in the silicon substrate 12 under the openings 18, and a thermal oxidation process is then performed to form a wall oxide layer 24 on the bottom surface and inner sidewall of the trenches 20, as shown in FIG. 2. The trenches 20 surround an active area 22.

Referring to FIG. 3, a silicon nitride liner layer 26 is formed to cover the wall oxide layer 24 and the pad nitride layer 16, and a silicon oxide liner layer 28 is then formed to cover the silicon nitride liner layer 26. In particular, the silicon nitride liner layer 26 is used to prevent the inner sidewall of the trenches 20, i.e., the silicon substrate 12, from over oxidation during the subsequent thermal oxidation process. Subsequently, a dielectric layer 30 is formed to fill the trenches 20, and the chemical mechanical polishing process is then performed to remove a portion of the silicon nitride liner layer 26 and the silicon oxide liner layer 28 from the silicon nitride layer 16 to complete the shallow trench isolation 10, as shown in FIG. 4. However, the prior art uses the silicon nitride liner layer 26, which is likely to form defects serving as electron-trapping sites, and therefore is not applicable to the preparation of the flash memory.

SUMMARY OF THE INVENTION

One aspect of the present invention provides a method for preparing a shallow trench isolation having a silicon oxide layer with a larger thickness at the bottom portion than at the upper portion of the trench and without using a silicon nitride liner layer so as to be applied to the preparation of the flash memory.

A method for preparing a shallow trench isolation according to this aspect of the present invention comprises the steps of forming at least one trench having an inner sidewall in a semiconductor substrate, nitrifying an upper portion of the inner sidewall, forming a spin-on dielectric layer filling the trench and covering the semiconductor substrate, and performing a thermal oxidation process to form a silicon oxide layer covering the inner sidewall, wherein the thickness of the silicon oxide layer at a bottom portion is larger than at the upper portion of the trench.

Another aspect of the present invention provides a method for preparing a shallow trench isolation comprising the steps of forming at least one trench having an inner sidewall in a semiconductor substrate, performing an implanting process to implant nitrogen-containing dopants into the inner sidewall, forming a spin-on dielectric layer filling the trench, and performing a thermal oxidation process to form a silicon oxide layer covering the inner sidewall, wherein the thickness of the silicon oxide layer at a bottom portion is larger than at an upper portion of the trench.

The prior art can not be applied to the preparation of the flash memory since it uses the silicon nitride liner layer, which is likely to form defects serving as electron-trapping sites. In contrast, the present invention can prepare the shallow trench isolation without using the silicon nitride liner layer; therefore, can be applied to the preparation of the flash memory. In addition, the present invention can prepare the shallow trench isolation with the silicon oxide layer having a larger thickness at the bottom portion than at the upper portion of the trench, which can effectively prevent the formation of voids in the shallow trench isolation.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

Figure 1:
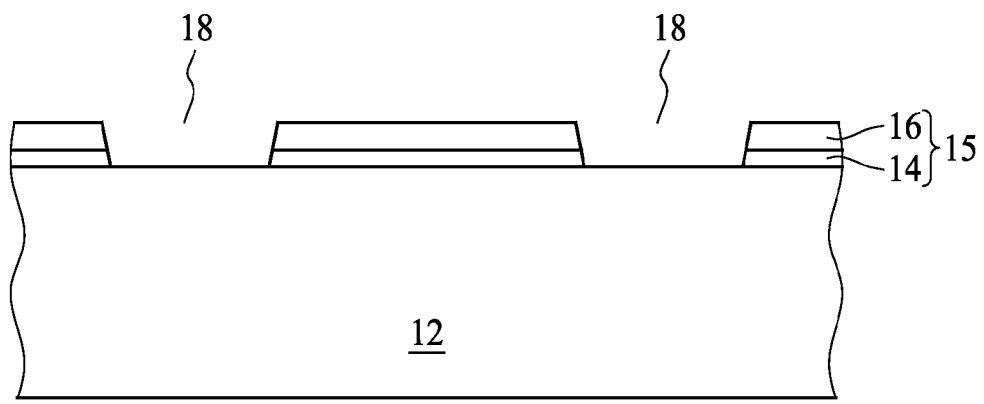
FIG. 1 to FIG. 4 illustrate a method for preparing a shallow trench isolation according to the prior art.
Figure 2:
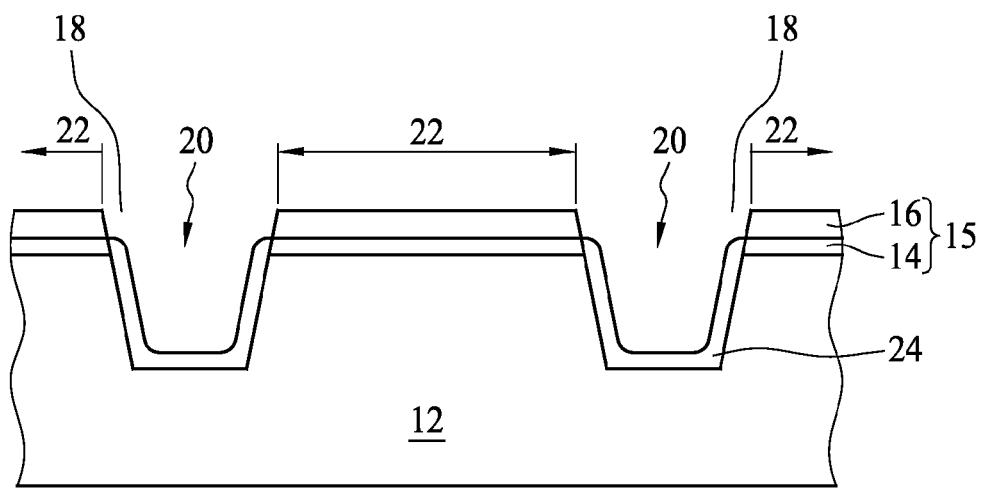
Figure 3:
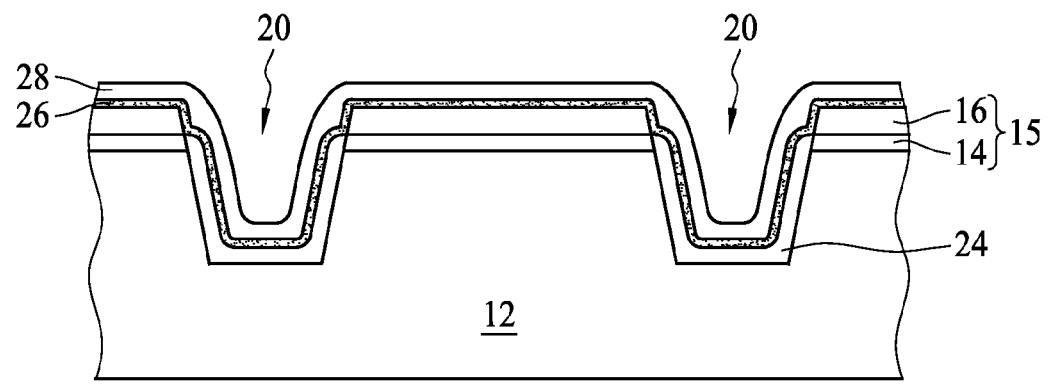
Figure 4:
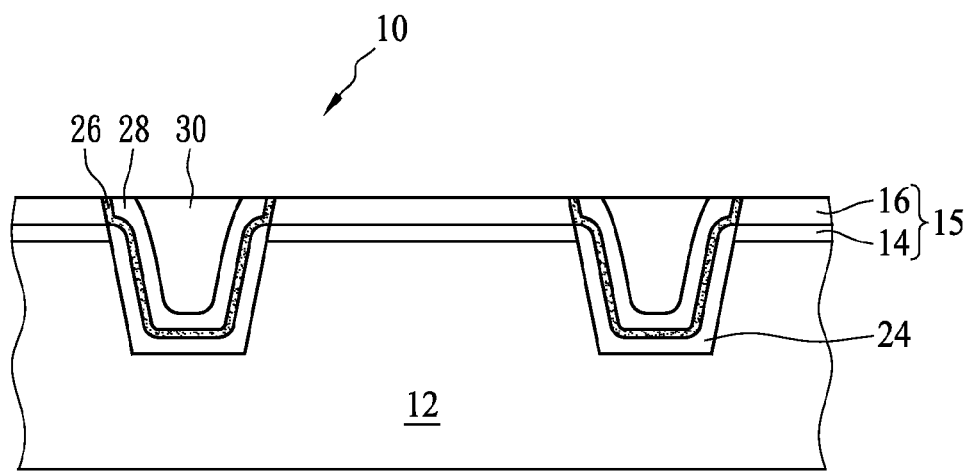
Figure 5:
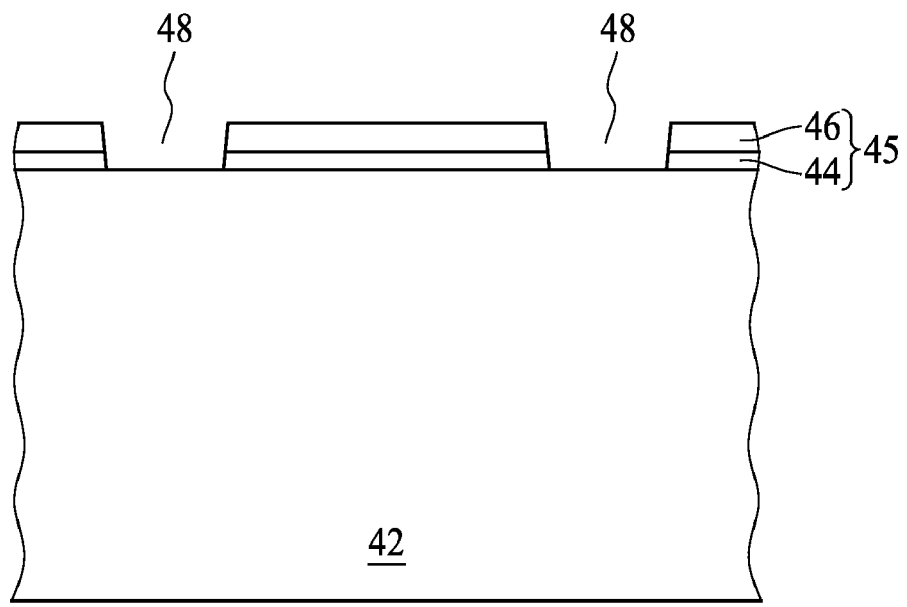
FIG. 5 to FIG. 10 illustrate a method for preparing a shallow trench isolation according to one embodiment of the present invention.
Figure 6:
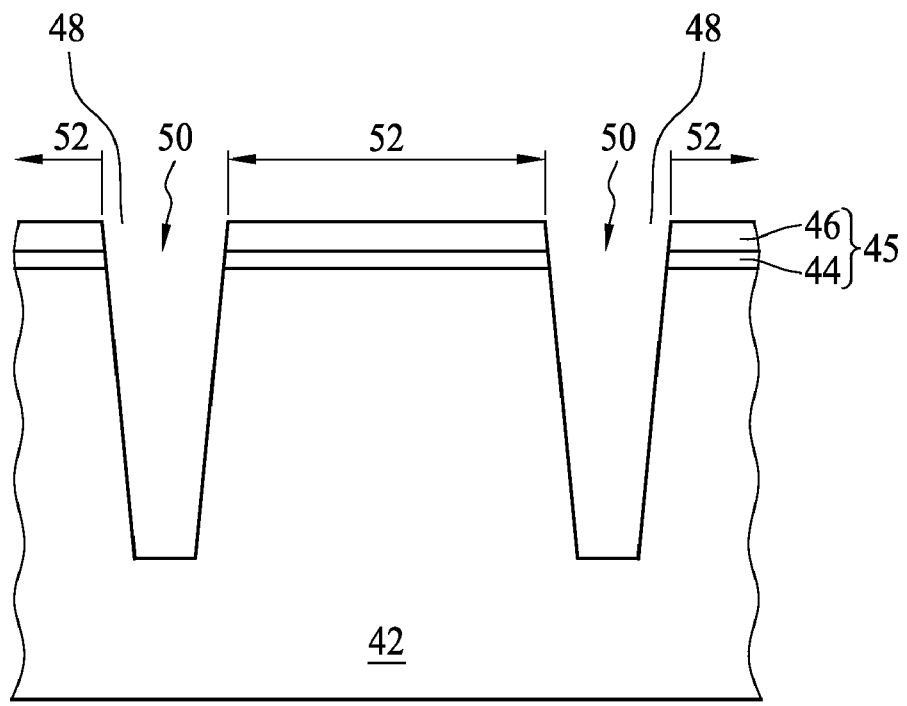

FIG. 5 to FIG. 10 illustrate a method for preparing a shallow trench isolation 40 according to one embodiment of the present invention. First, a mask 45 having a plurality of openings 48 is formed on a semiconductor substrate such as a silicon substrate 42, and the mask 45 includes a pad oxide layer 44 and a pad nitride layer 46. Subsequently, an anisotropic etching process is performed by using the mask 45 as the etching mask to form a plurality of trenches 40 in the silicon substrate 42 under the openings 48, and the trenches 40 surround an active area 42, as shown in FIG. 6.

Figure 7:
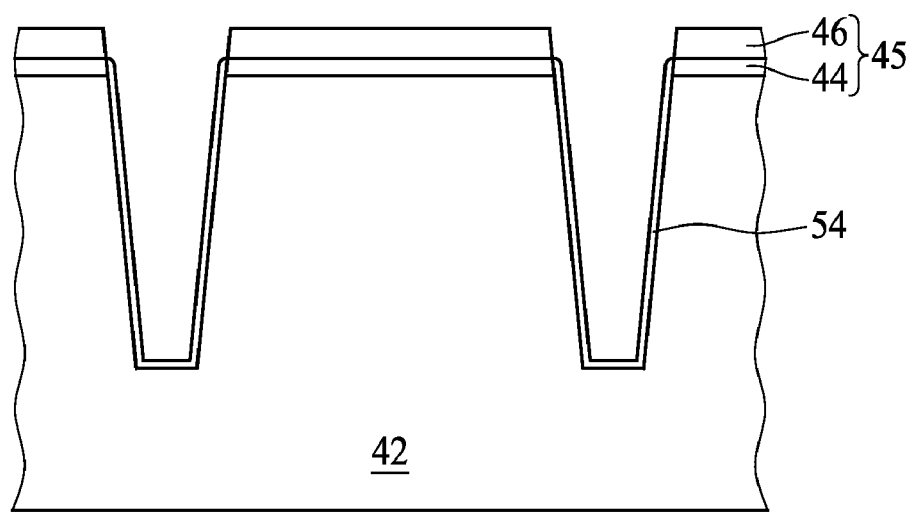
Figure 8:
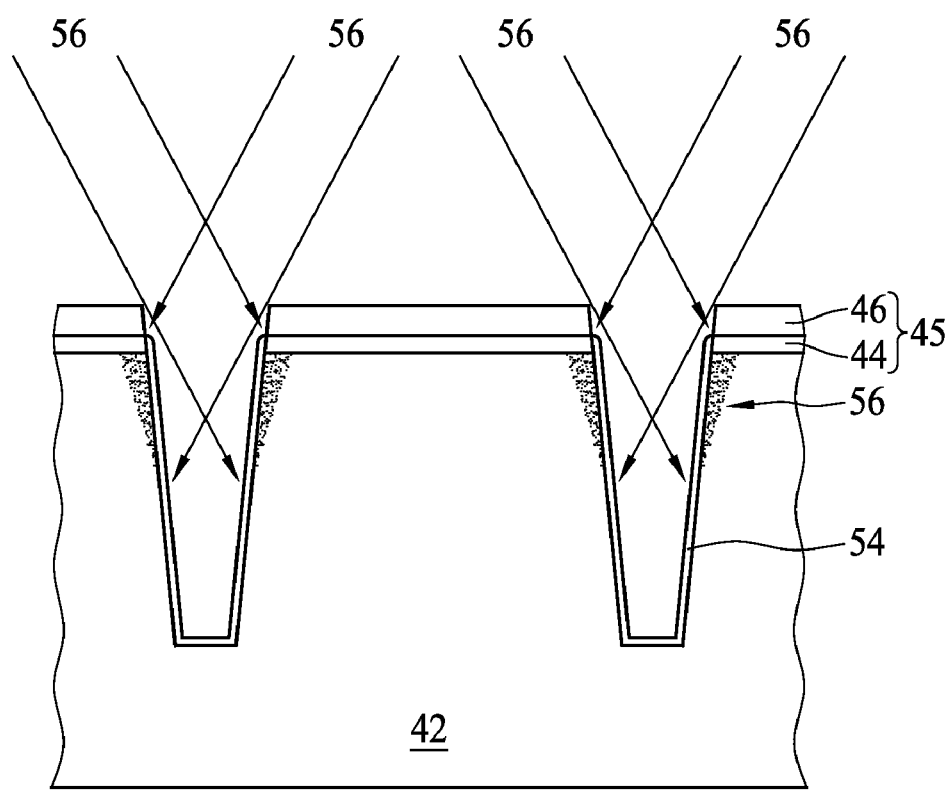

Referring to FIG. 7, a thermal treating process is performed to form a liner oxide layer 54 on the inner sidewall of the trenches 40 and the mask 45. Subsequently, an implanting process is performed to implant nitrogen-containing dopants 56 into the upper portion of the inner sidewall of the trench so as to nitrify the upper portion of the inner sidewall such that the concentration of the nitrogen-containing dopants 56 at the upper portion is higher than that at the bottom portion of the trench 50, as shown in FIG. 8. The implanting process can be a tilt implanting process or a plasma immersion process, and the nitrogen-containing dopants 56 can be ions selected from a group consisting of nitrogen atom, nitrogen gas, nitrous oxide and nitric oxide.

Figure 9:
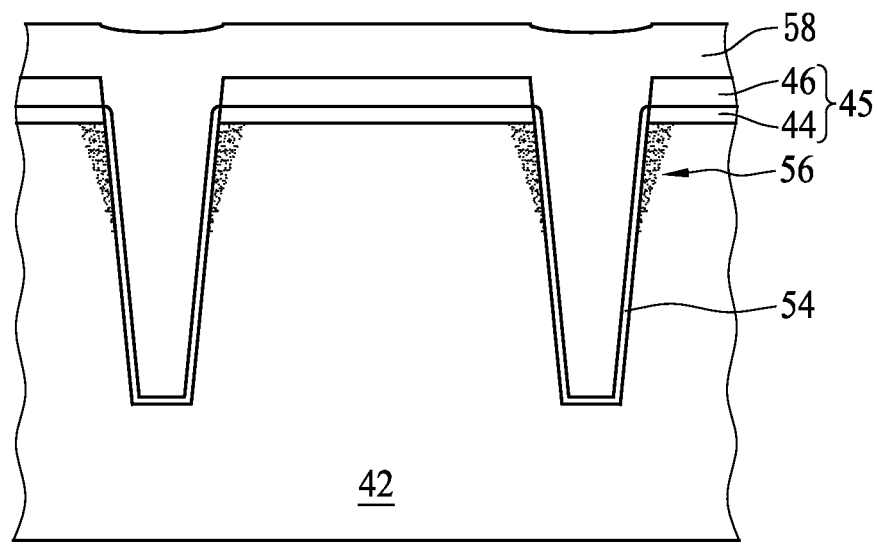
Figure 10:
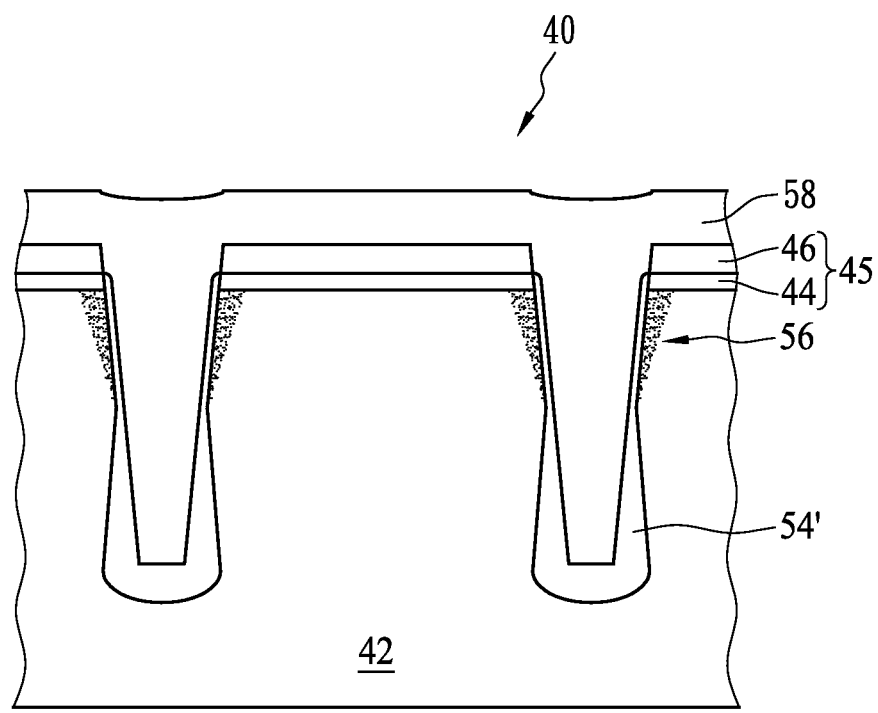

Referring to FIG. 9, a spin-coating process is performed to form a spin-on dielectric layer 58 filling the trenches 50 and covering the upper surface of the silicon substrate 52. In particular, the spin-coating process fills the trenches 50 with the liquid dielectric material, which has a better trench-filling ability and can be used to fill trenches with high aspect ratio. Subsequently, a thermal treating process is performed in an oxygen atmosphere to form a silicon oxide layer 54' coving the inner sidewall of the trenches 50 to complete the shallow trench isolation 40. Since the nitrogen-containing dopants 56 in the upper portion of the inner sidewall of the trenches 50 can inhibit the oxidation rate of the silicon substrate 42, the silicon oxide layer 54' formed by the thermal oxidation process has a larger thickness at the bottom portion than at the upper portion of the trenches 50, as shown in FIG. 10.

In particular, the space occupied by the silicon oxide layer 54' comes from the spin-on dielectric layer 58 and the silicon substrate 42, in which about 56% of the silicon oxide layer 54' comes from the spin-on dielectric layer 58 and about 44% of silicon oxide layer 54' comes from the silicon substrate 42. In other words, there is about 44% of silicon oxide generated in the bottom portion of the trenches 50. The thermal oxidation process removes solvent from the spin-on dielectric layer 58 to solidify the spin-on dielectric layer 58, and decreases the volume of the spin-on dielectric layer 58, which may generate voids in the bottom portion of the trenches 50. However, the 56% of silicon oxide generated from the silicon substrate 42 can compensate for the decreased volume of the spin-on dielectric layer 58 in the bottom portion of the trenches 50, which not only can prevent the formation of the voids in the bottom portion of the trenches 50, but also increase the density of the silicon oxide in the bottom portion of the trenches 50.

The prior art cannot be applied to the preparation of the flash memory since it uses the silicon nitride liner layer 26, which is likely to form defects serving as electron-trapping sites. In contrast, the present invention can prepare the shallow trench isolation 40 without using the silicon nitride liner layer; therefore, the present invention can be applied to the preparation of the flash memory. In addition, the present invention can prepare the shallow trench isolation 10 with the silicon oxide layer 54' having a larger thickness at the bottom portion than at the upper portion of the trenches 50, which can effectively prevent the formation of voids in the shallow trench isolation 40.

The above-described embodiments of the present invention are intended to be illustrative only. Numerous alternative embodiments may be devised by those skilled in the art without departing from the scope of the following claims.

What is claimed is:

1. A method for preparing a shallow trench isolation, comprising the steps of:
    forming at least one trench having an inner sidewall in a semiconductor substrate;
    nitrifying an upper portion of the inner sidewall;
    forming a spin-on dielectric layer filling the trench and covering the semiconductor substrate;
    performing a thermal oxidation process to form a silicon oxide layer covering the inner sidewall, wherein the thickness of the silicon oxide layer at a bottom portion is larger than at the upper portion of the trench; and
    forming a liner layer on the inner sidewall before the step of nitrifying an upper portion of the inner sidewall.

2. The method for preparing a shallow trench isolation of claim 1, wherein the step of forming a liner layer on the inner sidewall includes performing a thermal oxidation process.

3. The method for preparing a shallow trench isolation of claim 1, wherein the liner layer is a silicon oxide layer.

4. The method for preparing a shallow trench isolation of claim 1, wherein the step of nitrifying an upper portion of the inner sidewall includes performing a tilt implanting process to implant nitrogen-containing dopants into the upper portion of the inner sidewall.

5. The method for preparing a shallow trench isolation of claim 4, wherein the nitrogen-containing dopants are ions selected from a group consisting of nitrogen atom, nitrogen gas, nitrous oxide and nitric oxide.

6. The method for preparing a shallow trench isolation of claim 1, wherein the step of nitrifying an upper portion of the inner sidewall includes performing a plasma immersion process to implant nitrogen-containing dopants into the upper portion of the inner sidewall.

7. The method for preparing a shallow trench isolation of claim 6, wherein the nitrogen-containing dopants are ions selected from a group consisting of nitrogen atom, nitrogen gas, nitrous oxide and nitric oxide.

8. The method for preparing a shallow trench isolation of claim 1, wherein the thermal oxidation process solidifies the spin-on dielectric layer by removing solvent from the spin-on dielectric layer.

9. The method for preparing a shallow trench isolation of claim 1, wherein the step of forming at least one trench having an inner sidewall in a semiconductor substrate comprises:
    forming a mask having at least one opening on the semiconductor substrate;
    performing an anisotropic etching process to remove a portion of the semiconductor substrate from the opening to form the trench in the semiconductor substrate.

10. A method for preparing a shallow trench isolation, comprising the steps of:
    forming at least one trench having an inner sidewall in a semiconductor substrate;
    performing an implanting process to implant nitrogen-containing dopants into the inner sidewall;
    forming a spin-on dielectric layer filling the trench;
    performing a thermal oxidation process to form a silicon oxide layer covering the inner sidewall, wherein the thickness of the silicon oxide layer at a bottom portion is larger than at an upper portion of the trench; and
    forming a liner layer on the inner sidewall before the step of performing an implanting process to implant nitrogen-containing dopants into the inner sidewall.

11. The method for preparing a shallow trench isolation of claim 10, wherein the step of forming a liner layer on the inner sidewall includes performing a thermal oxidation process.

12. The method for preparing a shallow trench isolation of claim 10, wherein the liner layer is a silicon oxide layer.

13. The method for preparing a shallow trench isolation of claim 10, wherein the implanting process is a tilt implanting process to implant nitrogen-containing dopants into the upper portion of the inner sidewall.

14. The method for preparing a shallow trench isolation of claim 13, wherein the nitrogen-containing dopants are ions selected from a group consisting of nitrogen atom, nitrogen gas, nitrous oxide and nitric oxide.

15. The method for preparing a shallow trench isolation of claim 10, wherein the implanting process is a plasma immersion process to implant nitrogen-containing dopants into the upper portion of the inner sidewall.

16. The method for preparing a shallow trench isolation of claim 15, wherein the nitrogen-containing dopants are ions selected from a group consisting of nitrogen atom, nitrogen gas, nitrous oxide and nitric oxide.

17. The method for preparing a shallow trench isolation of claim 10, wherein the concentration of the nitrogen-containing dopants at the upper portion is higher than that at the bottom portion of the trench.

18. The method for preparing a shallow trench isolation of claim 10, wherein the step of forming at least one trench having an inner sidewall in a semiconductor substrate comprises:
    forming a mask having at least one opening on the semiconductor substrate;
    performing an anisotropic etching process to remove a portion of the semiconductor substrate from the opening to form the trench in the semiconductor substrate.

* * * * *